United States Patent
Duncan et al.

(10) Patent No.: US 11,956,918 B1
(45) Date of Patent: Apr. 9, 2024

(54) RECONFIGURABLE MODULAR OVER-RACK COMPONENT FOR MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/970,280

(22) Filed: Oct. 20, 2022

(51) Int. Cl.
*H05K 7/18* (2006.01)

(52) U.S. Cl.
CPC ...................... *H05K 7/18* (2013.01)

(58) Field of Classification Search
CPC ........................................................ H05K 5/00
See application file for complete search history.

(56) References Cited

U.S. PATENT DOCUMENTS

| 9,131,618 | B2 * | 9/2015 | Peterson | ................... H05K 7/14 |
| 10,869,405 | B1 * | 12/2020 | Bailey | ................... H05K 7/1492 |

\* cited by examiner

*Primary Examiner* — Jerry Wu
(74) *Attorney, Agent, or Firm* — Chamberlain, Hrdlicka, White, Williams & Aughtry; Aly Z. Dossa

(57) ABSTRACT

A modular information technology component includes: a modular over-rack component; and an information technology component, in which the modular over-rack component includes a set of information technology component openings, in which the set of information technology component openings enables mounting of the information technology component into the modular over-rack component.

14 Claims, 12 Drawing Sheets

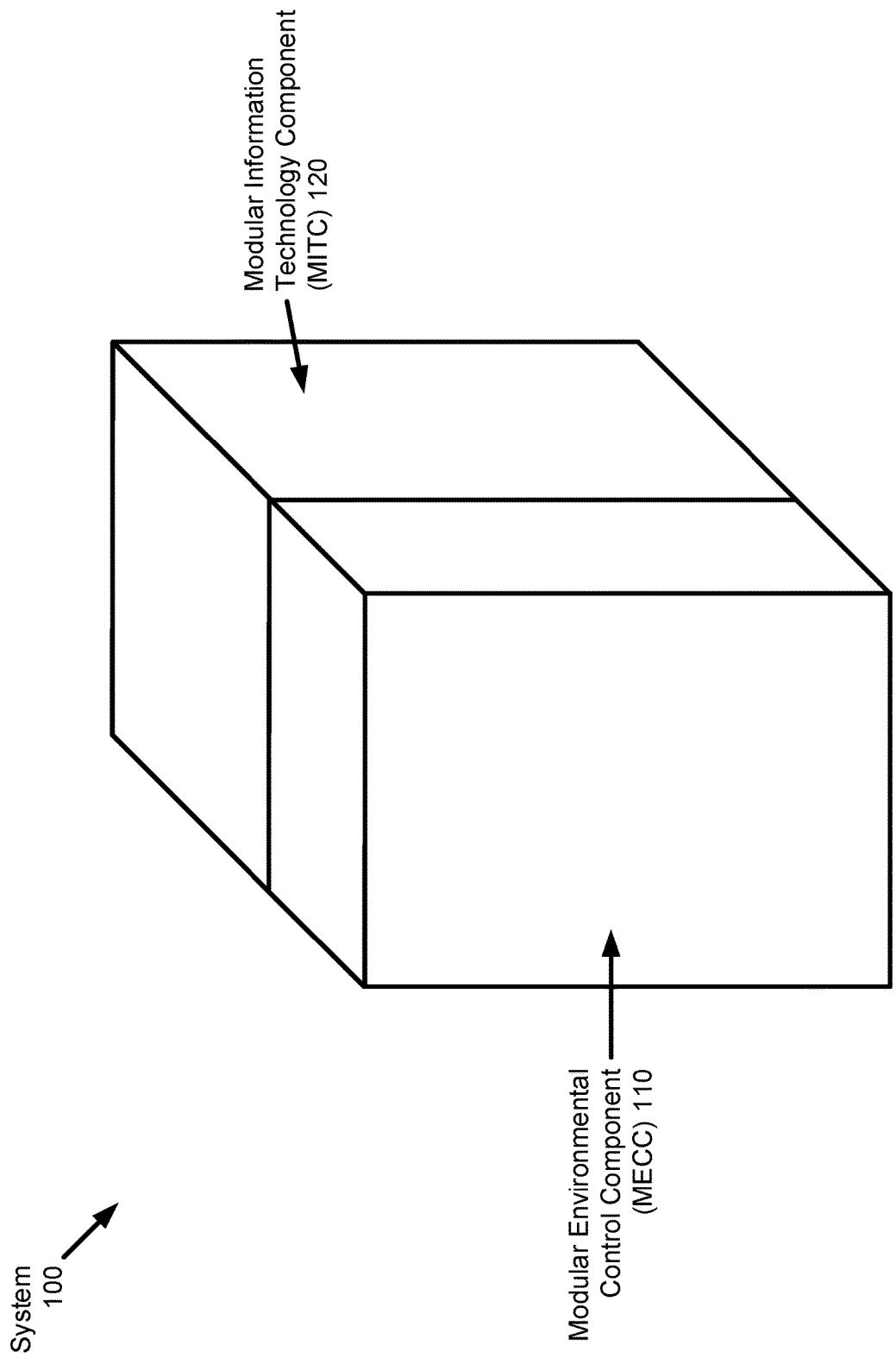

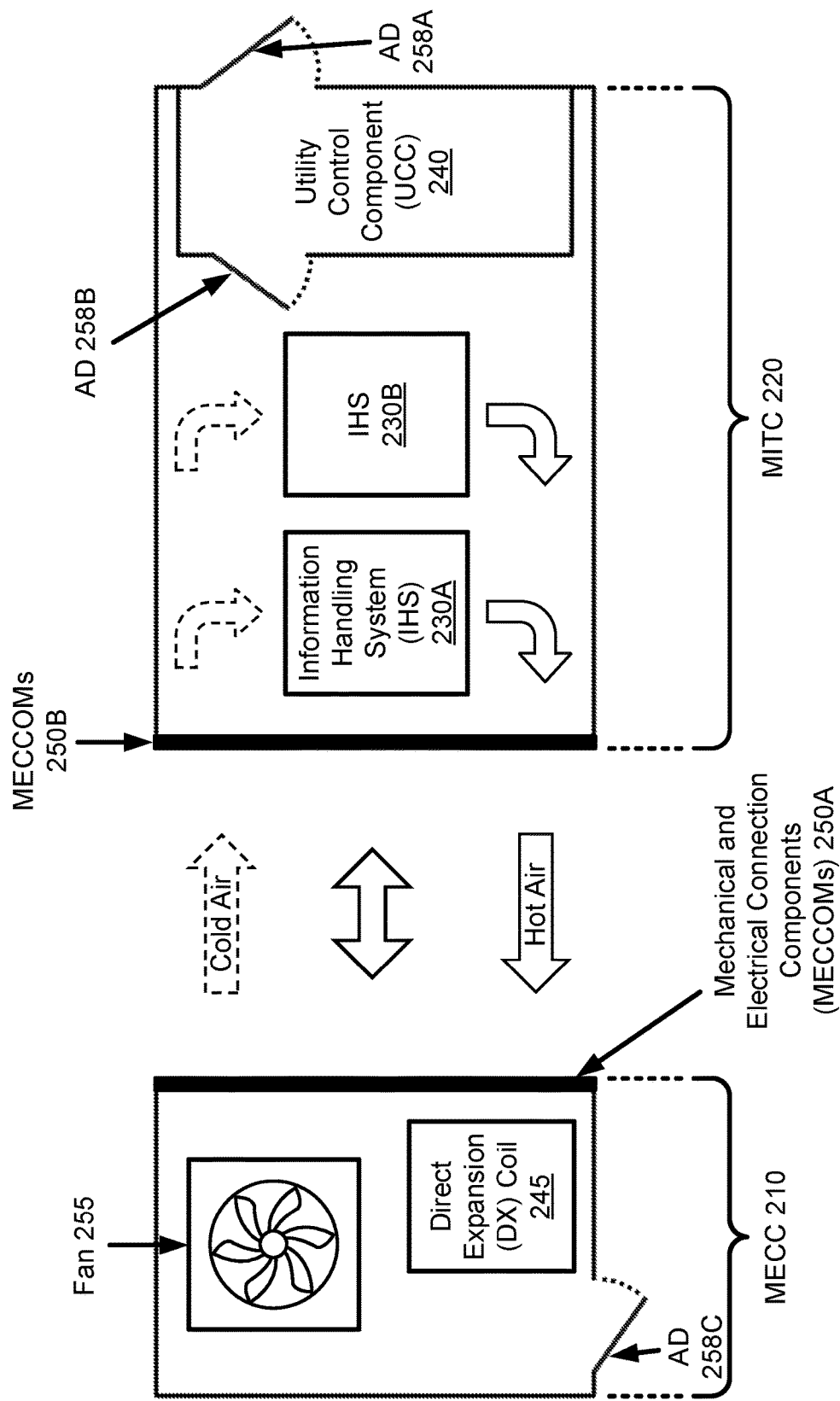
FIG. 2.1

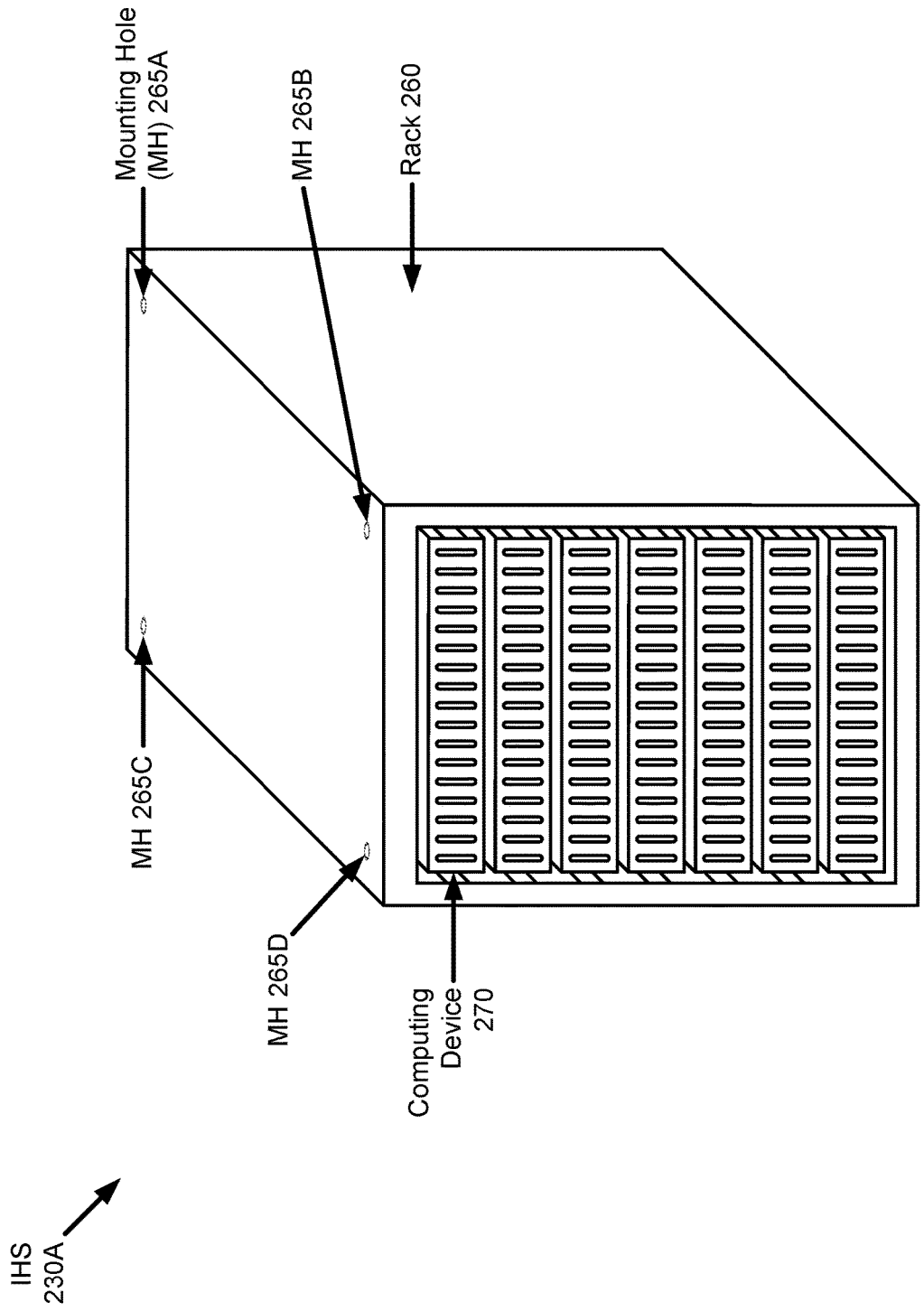
FIG. 2.2

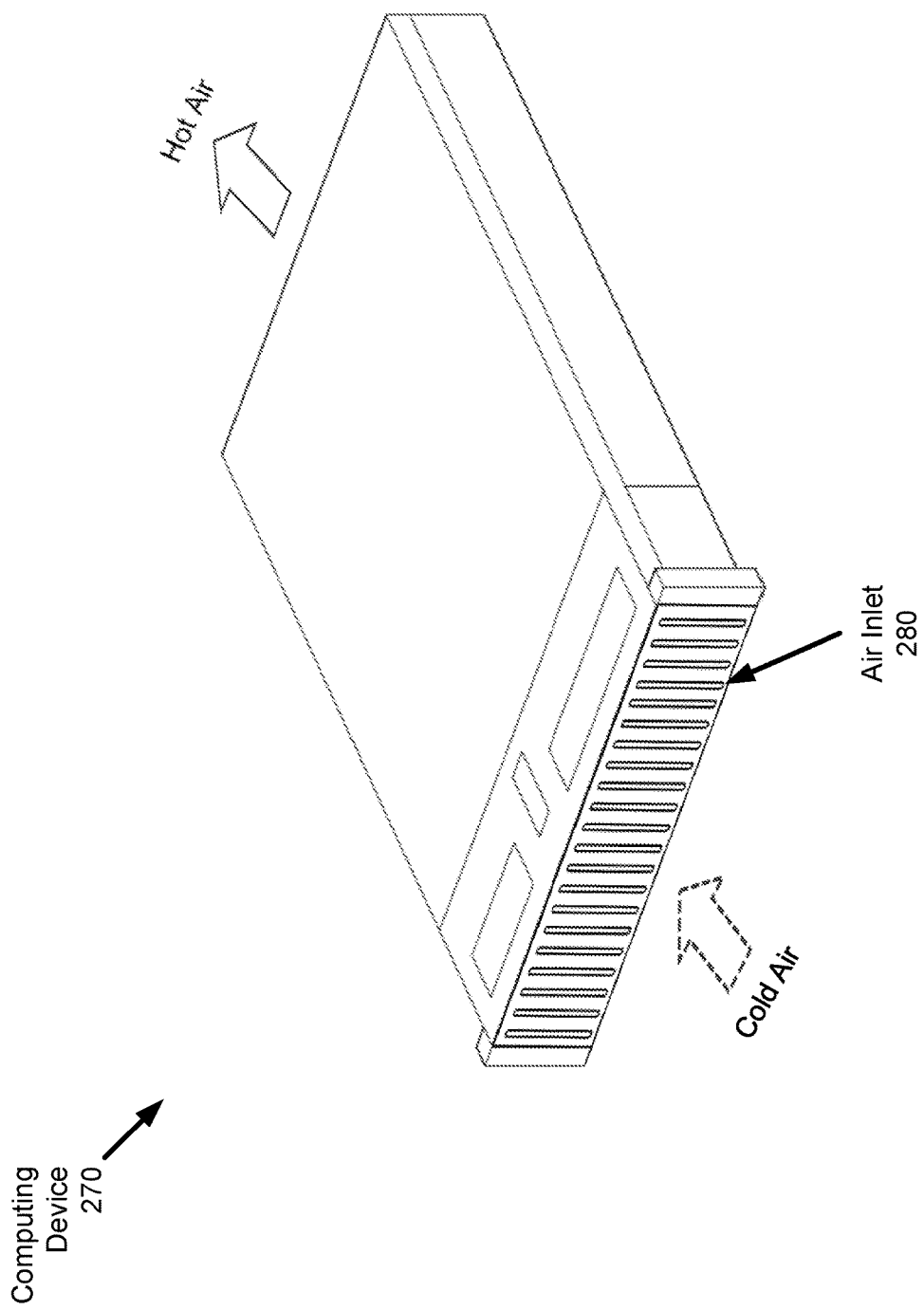
FIG. 2.3

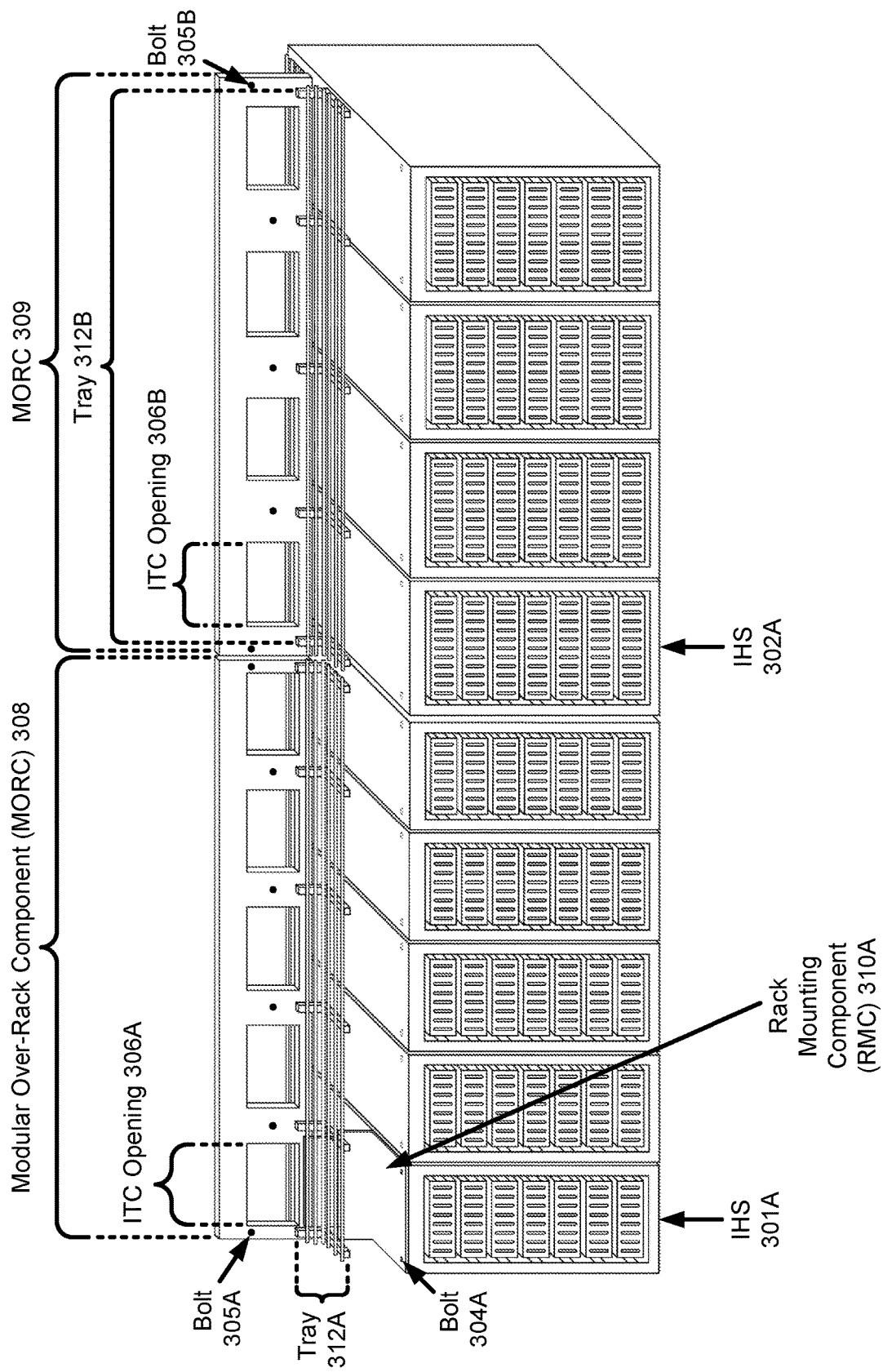
FIG. 3.1

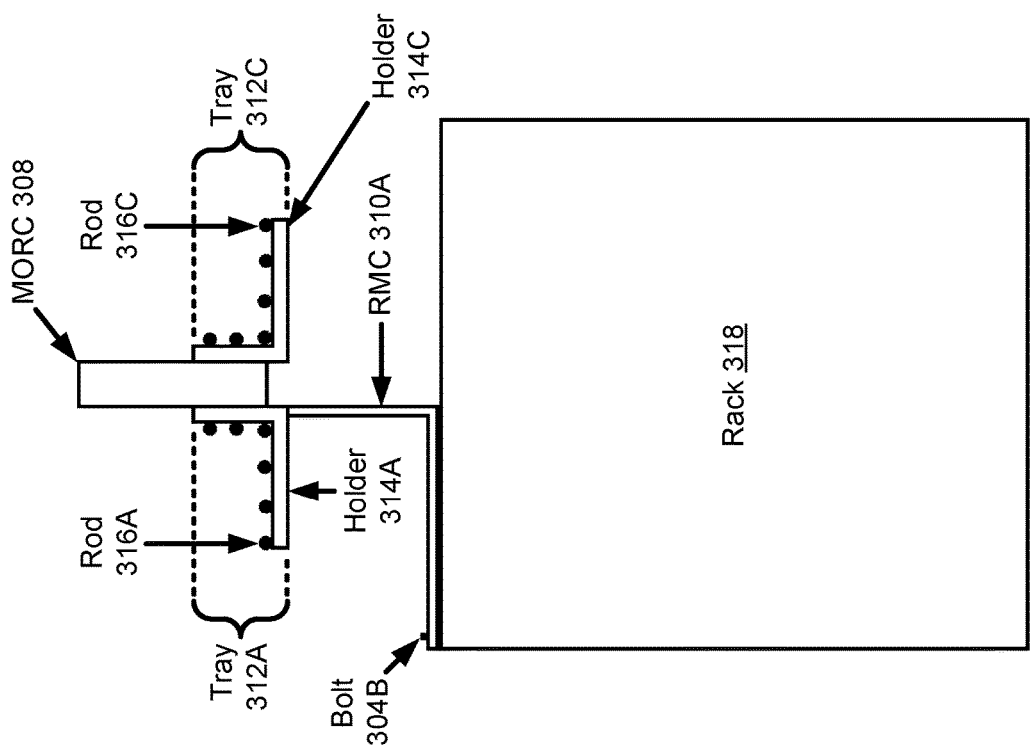
FIG. 3.2

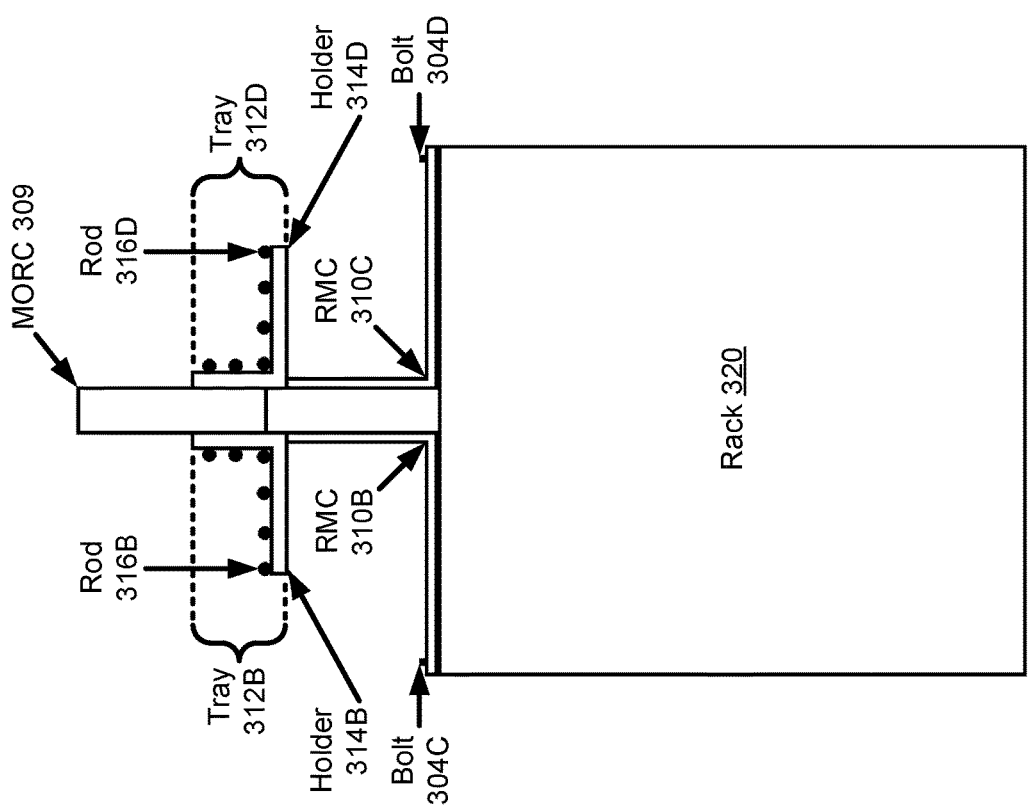
FIG. 3.3

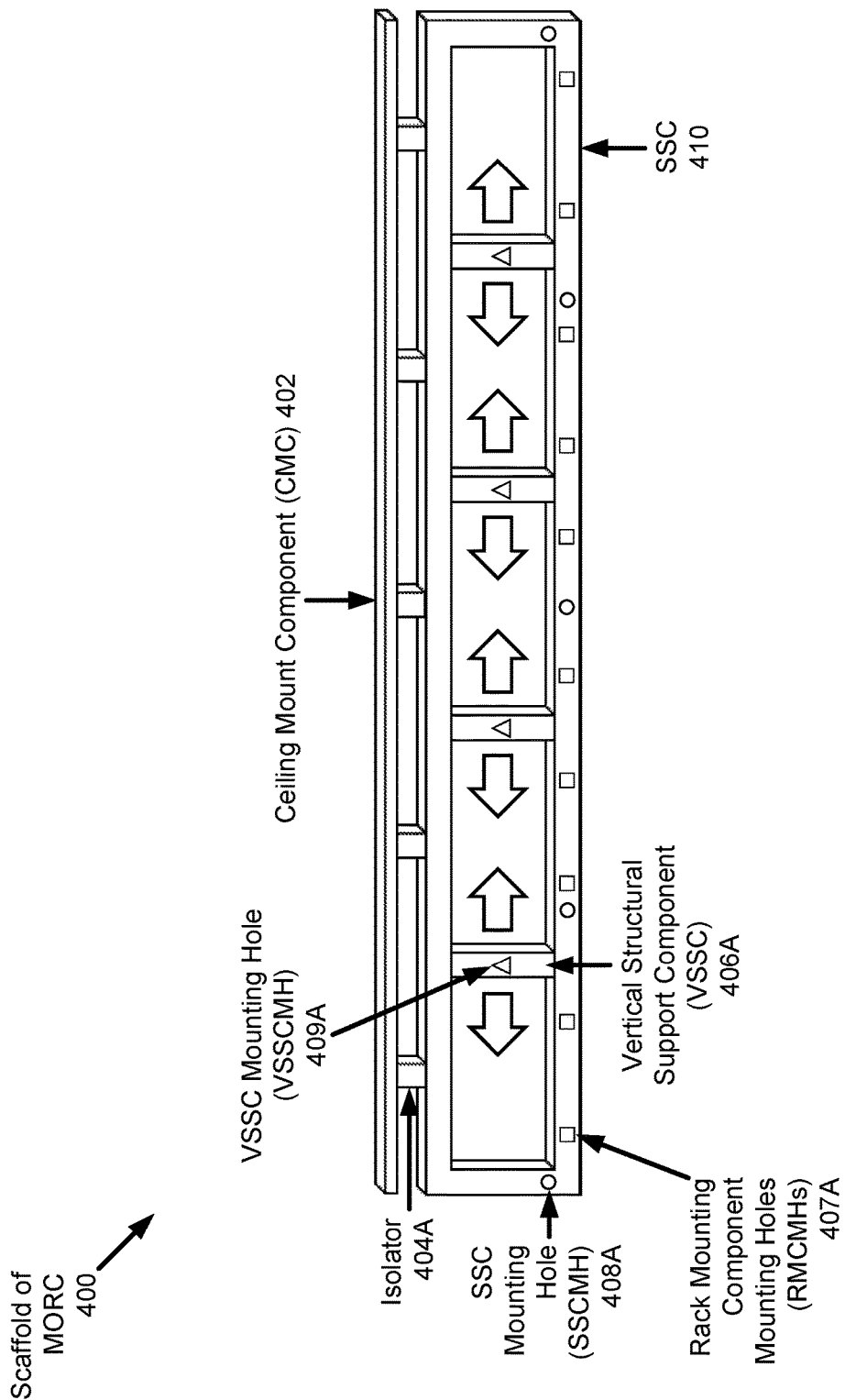
FIG. 4.1

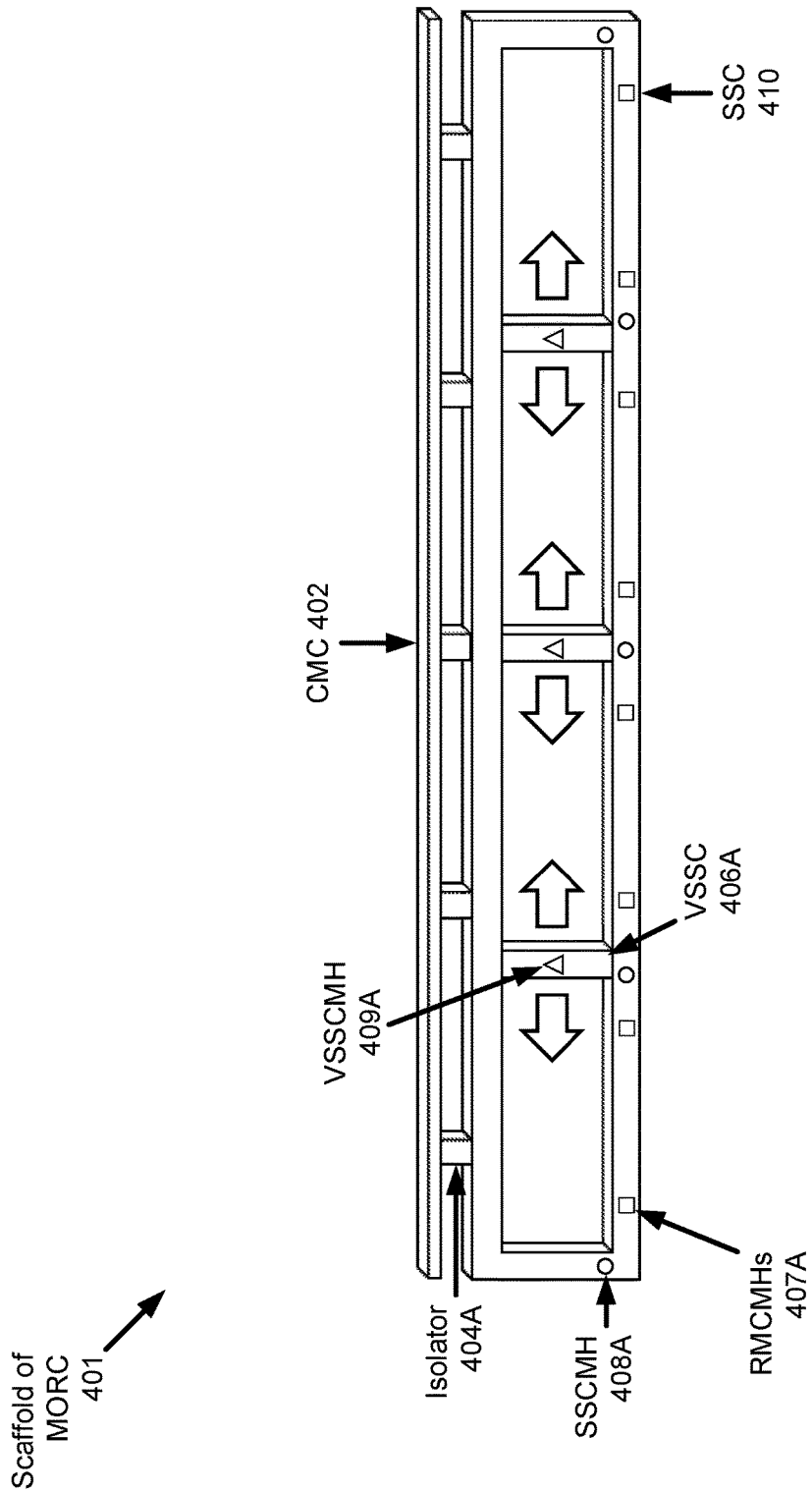
FIG. 4.2

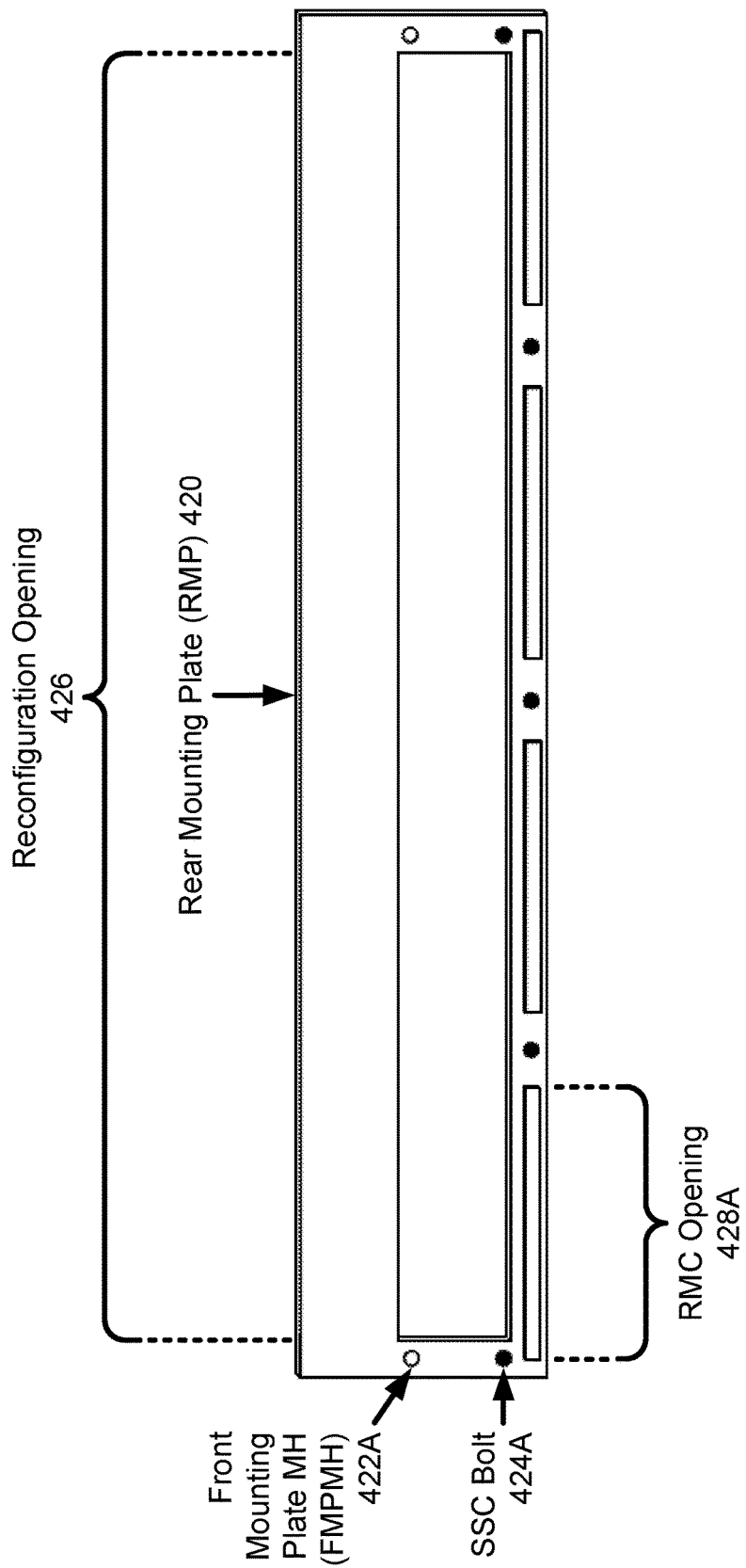
FIG. 4.3

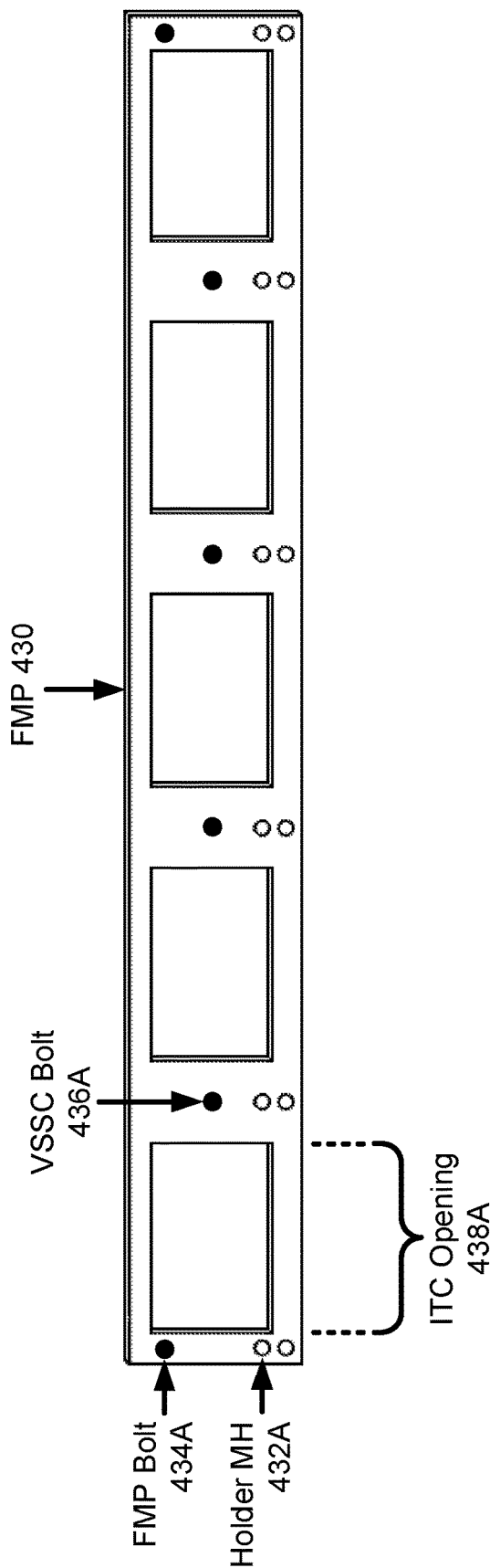
FIG. 4.4

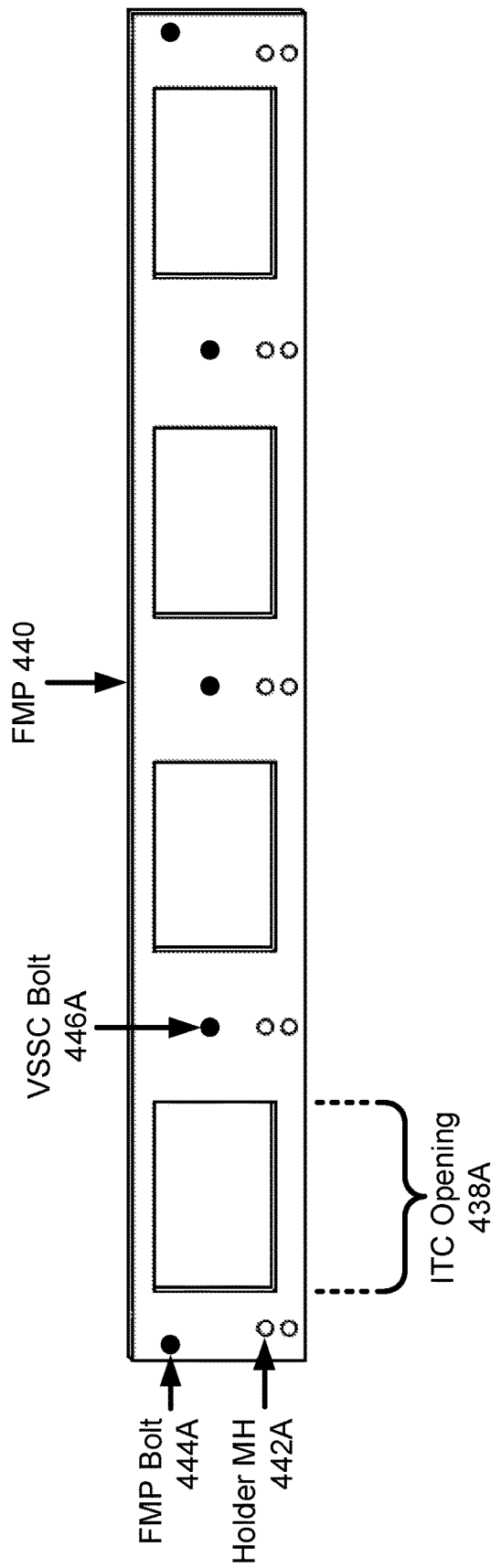
FIG. 4.5

RECONFIGURABLE MODULAR OVER-RACK COMPONENT FOR MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 1 shows a diagram of a system in accordance with one or more embodiments of the invention.

FIG. 2.1 shows a top view of the system of FIG. 1 in accordance with one or more embodiments of the invention.

FIG. 2.2 shows a diagram of an information handling system (IHS) in accordance with one or more embodiments of the invention.

FIG. 2.3 shows a diagram of a computing device in accordance with one or more embodiments of the invention.

FIG. 3.1 shows a diagram of a portion of the system of FIG. 1 in accordance with one or more embodiments of the invention.

FIGS. 3.2 and 3.3 show side views of a portion of the system of FIG. 1 in accordance with one or more embodiments of the invention.

FIGS. 4.1 and 4.2 show diagrams of a scaffold of a modular over-rack component (MORC) in accordance with one or more embodiments of the invention.

FIG. 4.3 shows a diagram of a rear mounting plate (RMP) in accordance with one or more embodiments of the invention.

FIGS. 4.4 and 4.5 show diagrams of a front mounting plate (FMP) in accordance with one or more embodiments of the invention.

DETAILED DESCRIPTION

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, before shipping a modular data center (MDC) to a customer site, IHSs and an over-rack component are pre-integrated into the MDC for safety purposes. Once the IHSs and the over-rack component are pre-integrated into the MDC, the MDC may then be shipped to the customer site. Typically, in order to accommodate (e.g., host) an information technology component (ITC) (e.g., a network switch, a network router, etc.), the over-rack component includes static (e.g., fixed) ITC openings that are aligned with each IHS (e.g., a first type of IHS) positioned below the over-rack component. However, when a second type of IHS is positioned below the over-rack component and/or the first type of IHS changes its position, the ITC openings will no longer be aligned with the IHSs positioned below the over-rack component. To accommodate the aforementioned alterations in the MDC, the over-rack component may need to be replaced, but replacing the over-rack component requires resource (e.g., engineering, manufacturing, procurement, etc.) intensive efforts.

To address one or more of the aforementioned issues, embodiments of the invention provide a reconfigurable modular over-rack component (MORC) that can accommodate the aforementioned alterations without replacing the MORC. More specifically, embodiments of the invention describe how to accommodate the aforementioned alterations using reconfigurable (e.g., adjustable) and non-reconfigurable subcomponents (e.g., an FMP, an RMP, a vertical structural support component (VSSC), etc.) of the MORC. This advantageously provides a flexibility to re-align ITC openings of the MORC to accommodate the aforementioned alterations without requiring the resource-intensive efforts and without replacing the entire MORC.

The following describes various embodiments of the invention.

As used herein, an "MDC" includes any facility or a portion of a facility in which computing operations are carried out. An MDC may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1, FIG. 1 shows a diagram of a system (100) in accordance with one or more embodiments of the invention. The system (100) includes a modular information technology component (MITC) (120) and a modular environmental control component (MECC) (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B), a utility control component (UCC) (240), and one or more MORCs (see FIG. 3.1) to be disposed within the MITC (220).

In one or more embodiments, while disposing, the IHSs (230A, 230B) may be affixed to a floor (not shown) within the MITC (220) via standard mechanical mechanisms (e.g., bolts, screws, nuts, studs, etc.). In one or more embodiments, the floor is affixed to a bottom side of the MITC (220). Other mechanical or non-mechanical (e.g., glue, an adhesive tape, etc.) mechanisms for affixing the IHSs (230A, 230B) to the floor may be used without departing from the scope of the invention.

In one or more embodiments, a white space within the MITC (220), where the IHSs (230A, 230B) are located, may have a functionality to host different types of standard racks (e.g., 4×750 millimeter (mm) wide racks, 5×600 mm wide racks, 5×48 rack unit (RU) racks, etc.). As a unit of measurement, the RU is equal to 1.75 inches and the RU defines an increment within a standard rack. The white space may also have a functionality to host custom designed racks. Both standard (e.g., off-the-shelf) racks and custom designed racks may be pre-integrated into the floor before transportation to the customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), battery racks, cable management towers, cooling distribution units (CDUs), etc.

The aforementioned example is not intended to limit the scope of the invention.

In one or more embodiments, while disposing, the MORCs may be affixed to a ceiling (e.g., a top side) of the MITC (220) via the standard mechanical mechanisms. Other mechanical or non-mechanical mechanisms for affixing the MORCs to the ceiling of the MITC (220) may be used without departing from the scope of the invention. Additional details of the MORCs are described below in reference to FIGS. 3.1-4.5.

In one or more embodiments, the MITC (220) may be implemented as other types of structures adapted to host, position, orient, and/or otherwise physically, mechanically, electrically, and/or thermally manage the IHSs (230A, 230B), the UCC (240), and the MORCs. In this manner, the MITC (220) may enable the IHSs (230A, 230B), the UCC (240), and the MORCs to be densely packed without negatively impacting the operation of the IHSs (230A, 230B), the UCC (240), and the MORCs.

In one or more embodiments, an IHS (e.g., 230A) may include a rack and any number of computing devices. Additional details of the IHS are described below in reference to FIGS. 2.2 and 2.3.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door. This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components.

In one or more embodiments, the mechanical connection components keep the MECC (210) connected to the MITC (220). The mechanical connection components also provide structural support to the MECC (210) and to the MITC (220) in case of a seismic event. The mechanical connection components may be, for example (but not limited to): steel plates with bolted connections, mechanical hard-stop components, sealing components, etc.

In one or more embodiments, "connected" may refer to "directly connected", in which there is a seal in between, for example, the connection interface of the MITC (220) and a connection interface of the MECC (210) (discussed below). Alternatively, "connected" may refer to "connected via one or more physical components in between". For example, the connection interface of the MITC (220) is connected to the connection interface of the MECC (210), in which at least one physical component is mechanically touching the connection interfaces.

In one or more embodiments, the electrical connection components may transmit or receive power and data (e.g., temperature data, humidity data, etc.) to or from the MECC (210). For example, the UCC (240) may collect a temperature of one or more components within the MITC (220) as temperature data. Based on the collected data, the UCC (240) may activate or deactivate the MECC (210) using the electrical connection components.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned examples are not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section, or a cross-section that changes over the length of the passageway.

In one or more embodiments, an area (e.g., height×width) enclosed by the connection interface of the MITC (220) is equal to an area enclosed by the connection interface of the MECC (210). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)-1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the end-to-end and medium form factor (e.g., medium shape) of the MDC (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the MDC.

Providing multiple functionalities and fitting these functionalities into the medium form factor make formation, deployment, and operation of the end-to-end MDC easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a diagram of the IHS (230A) in accordance with one or more embodiments of the invention. The IHS (230A) may include a rack (260) and any number of computing devices (e.g., 270).

In one or more embodiments, the rack (260) may be a mechanical structure that enables the computing devices to be positioned with respect to one another. For example, the rack (260) may be a mountable enclosure that enables the computing devices to be disposed within the rack (260). The rack (260) may be implemented as other types of structures adapted to host, position, orient, and/or otherwise physically, mechanically, electrically, and/or thermally manage the computing devices. By managing the computing devices, the rack (260) may enable the computing devices to be densely packed in a space without negatively impacting the operation of the IHS (230A).

In one or more embodiments, the rack (260) may include one or more mounting holes (MHs) (265A-265D). Additional details of the MHs are described below in reference to FIG. 3.1.

In one or more embodiments, a computing device (e.g., 270) may be a mechanical structure for housing components of the IHS (230A). For example, the computing device (e.g., 270) may be implemented as a rack-mountable enclosure for housing components of the IHS (230A). The computing device (e.g., 270) may be adapted to be disposed within the rack (260) and/or utilize services provided by the rack (260) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, a set of isolators (see FIG. 4.1) may be attached to the components (e.g., the IHSs (e.g., 230A, 230B, FIG. 2.1), the floor, the MORCs, etc.) of the system (e.g., 100, FIG. 1) to make sure that the components are ready-to-use when they deployed to the customer site. In one or more embodiments, the set of isolators provides a shock isolation to the components such that the components may be protected from any damage (e.g., a vibrational damage). Additional details of the set of isolators are described below in reference to FIG. 4.1.

Turning now to FIG. 2.3, FIG. 2.3 shows a diagram of the computing device (270) in accordance with one or more embodiments of the invention. In one or more embodiments, the computing device (270) includes six sides (i.e., top, bottom, right, left, front, and rear), in which air drawn into from a front side of the computing device (e.g., via an air inlet (280)) and expelled from the rear side of the computing device (e.g., via one or more ECCs). An airflow direction is shown with a dashed line arrow (cold air) and a solid line arrow (hot air). In general, air incoming from the front side of the computing device (270) is cooler than air outgoing from the rear side of the computing device (270).

In one or more embodiments, to provide services, the computing device (270) may utilize resources provided by a number of hardware components hosted within the computing device (270). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (270).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, the medium form factor of the system described in FIG. 2.1 may increase a PUE value of the computing device (270). For example, because the system described in FIG. 2.1 includes a separate cooling and/or heating unit (210), the computing device (270) may not have a fan and/or a heating component. In this manner, the computing device (270) may become more power dense and power-efficient.

Turning now to FIG. 3.1, FIG. 3.1 shows a diagram of a portion of the system of FIG. 1 in accordance with one or more embodiments of the invention. In an embodiment of the invention shown in FIG. 3.1, the embodiment includes a "first type" of IHSs (e.g., IHS (301A)), a "second type" of IHSs (e.g., IHS (302A)), a "first type" of MORC (e.g., MORC (308)), a "second type" of MORC (e.g., MORC (309)), and a rack mounting component (RMC) (310A). The IHS (301A) may be the same as the IHS (230A) as discussed above in reference to FIG. 2.1.

In one or more embodiments, a first group of IHSs and a second group of IHSs are deployed to the white space within the MITC (e.g., 220, FIG. 2.1). The first group of IHSs includes five of the first type of IHSs and the second group of IHSs includes four of the second type of IHSs. In one or more embodiments, the first type of IHS includes a 600 mm wide rack and the second type of IHS includes a 750 mm wide rack.

In one or more embodiments, within the first group of IHSs, the first type of IHSs are lined up in a row. Similarly, within the second group of IHSs, the second type of IHSs are lined up in a row, next to the first group of IHSs. As used herein, a "row" means a number of components arranged in a line. A row may include components arranged in a straight line or may include components arranged in a curved line. For example, a row of IHSs may include multiple IHSs arranged in a line.

The aforementioned example is not intended to limit the scope of the invention.

In one or more embodiments, instead of grouping the same IHSs into one group, different IHSs may be grouped into different groups. For example, instead of adding a first type of IHS into the first group of IHSs, that particular IHS may be added into the second group of IHSs. To accommodate this alteration in the second group of IHSs, without replacing the MORC (309), the MORC (309) may be reconfigured (discussed below). As yet another example, instead of adding a second type of IHS into the second group of IHSs, that particular IHS may be added into the first group of IHSs. To accommodate this alteration in the first group of IHSs, without replacing the MORC (308), the MORC (308) may be reconfigured.

The aforementioned examples are not intended to limit the scope of the invention.

In one or more embodiments, based on the arrangement of (or grouping of) the IHSs, the MORCs (308, 309) are affixed to the ceiling of the MITC (e.g., 220, FIG. 2.1). For example, the first type of MORC (308) is affixed above the first group of IHSs and the second type of MORC (309) is affixed above the second group of IHSs. In one or more embodiments, the first type of MORC (308) includes a first tray (e.g., a cable tray, a network cable tray, etc.) (312A), a second tray (e.g., 312C, FIG. 3.2), five ITC openings (e.g., 306A), a set of bolts (e.g., 305A), a scaffold (e.g., 400, FIG. 4.1), one or more RMPs (e.g., 420, FIG. 4.3), and one or more first FMPs (e.g., 430, FIG. 4.4). Similarly, the second type of MORC (309) includes a third tray (312B), a fourth tray (e.g., 312D, FIG. 3.3), four ITC openings (e.g., 306B), a set of bolts (e.g., 305B), a scaffold (e.g., 401, FIG. 4.2), one or more RMPs (e.g., 420, FIG. 4.3), and one or more second FMPs (e.g., 440, FIG. 4.5). Additional details of the scaffold, the RMP, the first FMP, and the second FMP are described below in reference to FIGS. 4.1-4.5.

In one or more embodiments, the MORC (308) includes six sides (i.e., top, bottom, right, left, front, and rear), in which the first tray (312A) is affixed to the front side of the MORC (308) and the second tray (e.g., 312C, FIG. 3.2) is affixed to the rear side of the MORC (308). Similarly, the MORC (309) includes six sides, in which the third tray (312B) is affixed to the front side of the MORC (309) and the fourth tray (e.g., 312D, FIG. 3.3) is affixed to the rear side of the MORC (309). Additional details of the trays are described below in reference to FIGS. 3.2 and 3.3.

In one or more embodiments, the MORC (308) includes five ITC openings (e.g., 306A) to be aligned with the first group of IHSs below the MORC (308); however, by reconfiguring the MORC (308), the MORC (308) may include any number of ITC openings (e.g., 306A). For example, after replacing the first group of IHSs with the second group of IHSs, the MORC (308) needs to include four ITC openings (e.g., 306B) to be aligned with the second group of IHSs. To accommodate this alteration (e.g., to transform five ITC openings (e.g., 306A) into four ITC openings (e.g., 306B)), the following steps need to be performed in order: (i) detach the first tray (312A) from the first FMP (e.g., 430, FIG. 4.4), (ii) remove the set of bolts (e.g., 305A) from the first FMP (e.g., 430, FIG. 4.4), (iii) detach the first FMP (e.g., 430, FIG. 4.4) from the RMP (e.g., 420, FIG. 4.3), (iv) detach the RMP (e.g., 420, FIG. 4.3) from the scaffold (e.g., 400, FIG. 4.1), (v) reconfigure (e.g., adjust) a position of a set of VSSCs (e.g., 406A, FIG. 4.1) within a cavity (e.g., an internal volume) of the SSC (e.g., 410, FIG. 4.1) to generate four ITC openings (e.g., 306B), (vi) attach (e.g., affix) the RMP (e.g., 420, FIG. 4.3) to the scaffold (e.g., 400, FIG. 4.1), (vii) attach the second FMP (e.g., 440, FIG. 4.5) to the RMP (e.g., 420, FIG. 4.3) using the set of bolts (e.g., 305A), and (viii) attach the first tray (312A) to the second FMP (e.g., 440, FIG. 4.5).

Continuing with the example discussed above, because the first group of IHSs are replaced with the second group of IHSs, the MORC (309) needs to include five ITC openings (e.g., 306A) to be aligned with the first group of IHSs. To accommodate this alteration (e.g., to transform four ITC openings (e.g., 306B) into five ITC openings (e.g., 306A)), the following steps need to be performed in order: (i) detach the third tray (312B) from the second FMP (e.g., 440, FIG. 4.5), (ii) remove the set of bolts (e.g., 305B) from the second FMP (e.g., 440, FIG. 4.5), (iii) detach the second FMP (e.g., 440, FIG. 4.5) from the RMP (e.g., 420, FIG. 4.3), (iv) detach the RMP (e.g., 420, FIG. 4.3) from the scaffold (e.g., 401, FIG. 4.2), (v) reconfigure a position of a set of VSSCs (e.g., 406A, FIG. 4.2) within a cavity of the SSC (e.g., 410, FIG. 4.2) to generate five ITC openings (e.g., 306A), (vi) attach the RMP (e.g., 420, FIG. 4.3) to the scaffold (e.g., 401, FIG. 4.2), (vii) attach the first FMP (e.g., 430, FIG. 4.4) to the RMP (e.g., 420, FIG. 4.3) using the set of bolts (e.g., 305B), and (viii) attach the third tray (312B) to the first FMP (e.g., 430, FIG. 4.4).

The aforementioned example is not intended to limit the scope of the invention.

In one or more embodiments, the aforementioned steps may also need to be performed at the rear sides of the MORCs (308, 309) (*i*) to transform five ITC openings (e.g., 306A) into four ITC openings (e.g., 306B), or (ii) to transform four ITC openings (e.g., 306B) into five ITC openings (e.g., 306A).

Those skilled in the art will appreciate that while the set of bolts (e.g., 305A, 305B, etc.) are used to attach (e.g., secure) the first FMP (e.g., 430, FIG. 4.4) and the second FMP (e.g., 440, FIG. 4.5) to the RMPs (e.g., 420, FIG. 4.3), any other mechanical or non-mechanical components may be used to secure the first FMP (e.g., 430, FIG. 4.4) and the second FMP (e.g., 440, FIG. 4.5) to the RMPs (e.g., 420, FIG. 4.3) without departing from the scope of the invention.

Those skilled in the art will appreciate that while the set of bolts (e.g., 305A, 305B, etc.) are shown as placed at a particular side of the first FMP (e.g., 430, FIG. 4.4) and the second FMP (e.g., 440, FIG. 4.5), the bolts (e.g., 305A, 305B, etc.) may be located on any other side of the first FMP (e.g., 430, FIG. 4.4) and the second FMP (e.g., 440, FIG. 4.5) without departing from the scope of the invention.

In one or more embodiments, the ITC openings (e.g., 306A, 306B, etc.) may have a functionality to host one or more ITCs. For example, based on a customer requirement, an ITC may need to be mounted to the ITC opening (e.g., 306A). An ITC may be, for example (but not limited to): a network switch, a network router, a battery, a UPS, etc. In one or more embodiments, the ITC openings (e.g., 306A, 306B, etc.) may also have a functionality to provide structural support to the ITCs in case of a seismic event. For this reason, the ITC openings (e.g., 306A, 306B, etc.) may include at least one or more mechanical hard-stops.

Those skilled in the art will appreciate that while the ITC openings (e.g., 306A, 306B, etc.) are shown as rectangular openings, the ITC openings (e.g., 306A, 306B, etc.) may be in another shape (while still providing the same functionalities) without departing from the scope of the invention.

Those skilled in the art will appreciate that while the ITC openings (e.g., 306A, 306B, etc.) are shown as having the same size (e.g., a 4 RU width) along the length of the MORCs (308, 309), the ITC openings (e.g., 306A, 306B, etc.) may have different sizes along the length of the MORCs (308, 309) without departing from the scope of the invention.

In one or more embodiments, when one or more IHSs are lined up in a row (discussed above), air from a cold air source (e.g., a cold aisle) may flow between, above, and/or below the IHSs, and may mix with air from a hot air source (e.g., a hot aisle). Air leaks of cold air or hot air between, above, and/or below the IHSs may reduce an efficiency of the MECC (e.g., 210, FIG. 2.1), and may cause the computing devices of the IHSs to receive inadequate cooling.

In some cases, hot air may mix with cold air in a cold aisle prior to the cold air being drawn into the computing devices, thus the hot air may pre-heat the cold air. In order to reduce air leaks and mixing of cold air with heated air (prior to the cold air being drawn into the computing devices), air containment components (e.g., RMC (310A)) may be used.

In one or more embodiments, "air containment" refers to physical barriers used in a hot aisle and/or in a cold aisle to minimize the mixing of cold (e.g., supply) air and hot (e.g., exhaust) air. The physical barriers prevent hot "exhaust" air from flowing over the tops of the IHSs, mixing with the cold "supply" air, and thereby increase cooling capacity of the cold air. With the air containment components in place, for example, the MECC (e.g., 210, FIG. 2.1) may reduce its fan speeds and may use higher temperature chilled water. Otherwise, the MECC (e.g., 210, FIG. 2.1) may need to operate longer to make up for higher temperatures in the cold aisle and to enhance thermal management of the internal environment of the MITC (e.g., 220, FIG. 2.1).

In one or more embodiments, as an air containment component, the RMC (310A) may segregate cold air in a cold aisle from hot air in a hot aisle (or from other air in the MITC (e.g., 210, FIG. 2.1)). In this manner, the RMC (310A) may (i) increase cooling efficiency of the MECC (e.g., 210, FIG. 2.1), (ii) reduce the amount of time that the MECC (e.g., 210, FIG. 2.1) needs to operate, (iii) reduce recirculation (e.g., mixing of hot air with cold air), (iv) bypass airflow from one aisle to another aisle, (v) improve usability and serviceability of the computing devices (e.g., 270, FIG. 2.2), (vi) enhance thermal management of the internal environment of the MITC (e.g., 220, FIG. 2.1), (vii) prevent damage to the hardware components of the computing devices (e.g., 270, FIG. 2.2), and (viii) improve functionality of the hardware components of the computing devices (e.g., 270, FIG. 2.2).

In one or more embodiments, to further support the air containment within the MITC (e.g., 220, FIG. 2.1) and to provide a better cold air distribution, for example, (i) additional RMCs may be affixed to a bottom side of the IHSs (e.g., 301A, 302A, etc.) and (ii) the IHSs (e.g., 301A, 302A, etc.) may be affixed to a "raised floor", which is affixed to the bottom side of the MITC (e.g., 220, FIG. 2.1).

The aforementioned example is not intended to limit the scope of the invention.

A "raised floor" is a data center construction model where a slightly higher floor is constructed above a floor (e.g., a bottom side) of a data center. A raised floor generates an open space between the two floors for a better (i) cold air distribution (via, for example, bottom ducting components), (ii) air containment, and (iii) cable management within the data center.

In one or more embodiments, in order to secure (e.g., to restrain) the IHS (301A) to the MORC (308), the RMC (310A) may be a bracket (e.g., an L bracket) that includes two portions (e.g., the first portion and the second portion). For example, a first portion of the RMC (310A) refers to a portion of the RMC (310A) that is secured to the MHs (e.g., 265B, 265D, FIG. 2.2) to affix the RMC (310A) to the top side of the IHS (301A). A second portion of the RMC (310A) refers to a portion of the RMC (310A) that is secured to a first set of rack mounting component mounting holes (RMCMHs) (e.g., 407A, FIG. 4.1) of the scaffold (e.g., 400, FIG. 4.1) to affix the RMC (310A) to the front side of the MORC (308).

In one or more embodiments, the first portion of the RMC (310A) includes a first set of holes (not shown) that allows one or more bolts (e.g., 304A) to pass through and interface with the MHs (e.g., 265B, 265D, FIG. 2.2). When the first set of holes is aligned with the MHs (e.g., 265B, 265D, FIG. 2.2), the bolts (e.g., 304A) are used to secure the RMC (310A) to the top side of the IHS (301A).

Further, the second portion of the RMC (310A) includes a second set of holes (not shown) to be aligned with the first set of RMCMHs (e.g., 407A, FIG. 4.1). The second set of holes allows a set of bolts (not shown) to pass through and interface with the first set of RMCMHs (e.g., 407A, FIG. 4.1). When the second set of holes is aligned with the first set of RMCMHs (e.g., 407A, FIG. 4.1), the set of bolts is used to secure the RMC (310A) to the front side of the MORC (308). In this manner, the IHS (301A) is secured to the MORC (308).

In one or more embodiments, in addition to being an air containment component, the RMC (310A) acts as a mechanical hard-stop component. In this manner, the RMC (310A) may provide structural support to the IHS (301A) and to the MORC (308) in case of a seismic event. The RMC (310A) may also provide structural support to the IHS (301A) to keep the IHS (301A) connected to the MORC (308).

Those skilled in the art will appreciate that while the bolts (e.g., 304A) are used to secure the RMC (310A) to the top side of the IHS (301A) and to the front side of the MORC (308), any other mechanical or non-mechanical components may be used to secure the secure the RMC (310A) to the top side of the IHS (301A) and to the front side of the MORC (308) without departing from the scope of the invention.

Those skilled in the art will appreciate that while the RMC (310A) is shown as a bracket, the RMC (310A) may be in another shape (while still providing the same functionalities) without departing from the scope of the invention.

Those skilled in the art will appreciate that while the RMC (310A) is shown as a single (e.g., a monolithic) component, the RMC (310A) may be manufactured as having at least two components (while still providing the same functionalities) without departing from the scope of the invention.

In one or more embodiments, the RMC (310A) may be, for example (but not limited to): a blanking panel, a close-out panel, a plastic curtain, a Plexiglas sheet, a sheet metal, etc.

In one or more embodiments, because the IHS (301A) includes, for example, a 600 mm wide rack (e.g., a "first type" of rack), the RMC (310A) may be referred to as a "first type" of RMC. In this manner, because the IHS (302A) has a rack width (e.g., 750 mm wide rack) greater than the rack width of the IHS (301A), a "second type" of RMC (not shown) may need to be used (i) to secure the IHS (302A) to the MORC (309) and (ii) to further support the air containment within the MITC (e.g., 220, FIG. 2.1).

In one or more embodiments, as an additional airflow management strategy to minimize air leakage, the first FMP (e.g., 430, FIG. 4.4) and the second FMP (e.g., 440, FIG. 4.5) may include air restrictors for cable feeds where they enter into the MORCs (308, 309). In one or more embodiments, an air restrictor may be, for example (but not limited to): a brush cable pass-thru component, a brush grommet, etc. Further, to close any gaps that exist between two RMCs (e.g., between the RMC (310A) and a second RMC), another RMC (in any shape or in any size) may be affixed to the RMCs. In this manner, air leakage may also be minimized.

To further improve the cooling efficiency of the MECC (e.g., 210, FIG. 2.1), for example, the second portion of the RMC (310A) may include a gasket (e.g., a continuity gasket) to seal air from leaking past the RMC (310A). In one or more embodiments, the gasket may be, for example (but not limited to): a foam gasket, a rubber gasket, etc.

In addition, the ITC openings (e.g., 306A, 306B, etc.) may include a shutter (not shown) to support the air containment within the internal environment of the MITC (e.g., 220, FIG. 2.1). For example, when an ITC needs to be placed (e.g., mounted) within the ITC opening (306A), the shutter of the ITC opening (306A) needs to be opened. The ITC may be then be mounted within the ITC opening (306A). As yet another example, if the ITC opening is not in use, the shutter of the ITC opening (306A) may be closed. In this manner, the shutter may act as an air containment component to minimize mixing of hot air and cold air.

The aforementioned examples are not intended to limit the scope of the invention.

Those skilled in the art will appreciate that while a single RMC (310A) is affixed to the MORC (308) and to the IHS (301A), additional RMCs may be affixed to the MORC (308) and to the IHS (301A) without departing from the scope of the invention.

Those skilled in the art will appreciate that while the details of the RMC (310A), the IHSs (301A, 302A), and the MORCs (308, 309) are discussed above, those details also apply to other RMCs, IHSs, and MORCs disposed within the MITC (e.g., 220, FIG. 2.1) without departing from the scope of the invention.

FIGS. 3.2 and 3.3 show side views of a portion of the system (e.g., 100, FIG. 1) including different types of racks (318, 320), different types of MORCs (308, 309), and different types of RMCs (310A-310C) in accordance with one or more embodiments of the invention.

Turning now to FIG. 3.2, FIG. 3.2 shows a side view of a portion of the system (e.g., 100, FIG. 1) in accordance with one or more embodiments of the invention. In an embodiment of the invention shown in FIG. 3.2, the embodiment includes a rack (318), the first tray (312A), the second tray (312C), the MORC (308), and the RMC (310A). The rack (318) may be the rack of the IHS (301A) as discussed above in reference to FIG. 3.1. For this reason, the RMC (310A) may be the first type of RMC as discussed above in reference to FIG. 3.1.

As discussed above in reference to FIG. 3.1, the RMC (310A) includes two portions. As shown in FIG. 3.2, the first portion of the RMC (310A) allows the bolts (e.g., 304B) to pass through and interface with the first set of MI-Is (e.g., 265B, 265D, FIG. 2.2). When the first set of holes of the RMC (310A) is aligned with the MI-Is (e.g., 265B, 265D, FIG. 2.2), the bolts (e.g., 304B) are used to secure the RMC (310A) to the top side of the rack (318).

Further, the second set of holes of the RMC (310A) allows the set of bolts to pass through and interface with the first set of RMCMHs (e.g., 407A, FIG. 4.1). When the second set of holes is aligned with the first set of RMCMHs (e.g., 407A, FIG. 4.1), the set of bolts is used to secure the RMC (310A) to the front side of the MORC (308). In this manner, the rack (318) is secured to the MORC (308). Details of the RMC are described above in reference to FIG. 3.1.

Those skilled in the art will appreciate that while the bolts (e.g., 304B) are used to secure the RMC (310A) to the top side of the rack (318) and to the front side of the MORC (308), any other mechanical or non-mechanical components may be used to secure the secure the RMC (310A) to the top side of the rack (318) and to the front side of the MORC (308) without departing from the scope of the invention.

As discussed above in reference to FIG. 3.1, the first tray (312A) is affixed to the front side of the MORC (308) and the second tray (312C) is affixed to the rear side of the MORC (308). More specifically, the first tray (312A) is affixed to a first FMP (e.g., 430, FIG. 4.4) located on the front side of the MORC (308) and the second tray (312C) is affixed to a first FMP (e.g., 430, FIG. 4.4) located on the rear side of the MORC (308).

In one or more embodiments, the first tray (312A) includes a first holder (e.g., holder (314A)) and a first set of rods (e.g., 316A). As being mechanical support components, both the first holder (314A) and the first set of rods (e.g., 316A) are configured to carry cables (e.g., power cables, network cables, etc.) that are routed from one component (e.g., a network switch, a modular power supply component, etc.) to another component (e.g., a network router, a computing device, etc.) for power distribution, control, and communication. Further, the first holder (314A) and the first set of rods (e.g., 316A) are configured to prevent cable congestion at the front side of the rack (318) for a better cable management.

For example, a network cable may be routed directly from the first tray (312A) to a line card (e.g., a modular electronic circuit interfacing with a network) included in the rack (318). In this manner, the first tray (312A) may help the network communication between the network switch and the computing devices disposed within the rack (318).

The aforementioned example is not intended to limit the scope of the invention.

Similarly, the second tray (312C) includes a second holder (e.g., holder (314C)) and a second set of rods (e.g., 316C). As being mechanical support components, both the second holder (314C) and the second set of rods (e.g., 316C) are configured to carry cables that are routed from one component to another component for power distribution, control, and communication. Further, the second holder (314C) and the second set of rods (e.g., 316C) are configured to prevent cable congestion at the rear side of the rack (318) for a better cable management.

For example, a second network cable may be routed directly from the second tray (312C) to the line card included in the rack (318). In this manner, the second tray (312C) may help the network communication between the network switch and the computing devices disposed within the rack (318).

The aforementioned example is not intended to limit the scope of the invention.

As used herein, a "cable" includes any cable, conduit, or line that carries one or more conductors and that is flexible over at least a portion of its length. A cable may include a connector portion, such as a plug, at one or more of its ends.

In one or more embodiments, the holders (e.g., 314A, 314C, etc.) and the rods (e.g., 316A, 316C, etc.) may be made of, for example (but not limited to): galvanized steel, stainless steel, aluminum, glass-fiber reinforced plastic, etc.

Those skilled in the art will appreciate that while the rods (e.g., 316A, 316C, etc.) and the holders (e.g., 314A, 314C, etc.) are shown as having a particular size, shape, and placement, the rods (e.g., 316A, 316C, etc.) and the holders (e.g., 314A, 314C, etc.) may have any size, shape, and placement (while still providing the same functionalities) without departing from the scope of the invention.

Turning now to FIG. 3.3, FIG. 3.3 shows a side view of a portion of the system (e.g., 100, FIG. 1) in accordance with one or more embodiments of the invention. In an embodiment of the invention shown in FIG. 3.3, the embodiment includes a rack (320), the third tray (312B), the fourth tray (312D), the MORC (309), and the RMCs (310B, 310C). The rack (320) may be the rack of the IHS (302A) as discussed above in reference to FIG. 3.1. For this reason, the RMCs (310B, 310C) may be the second type of RMCs as discussed above in reference to FIG. 3.1.

In comparison to the FIG. 3.2 and as another option, two RMCs (310B, 310C) are used to secure the rack (320) to the MORC (309). In this manner, (i) a level of structural support to the rack (320) may be increased and (ii) the cooling efficiency of the MECC (e.g., 210, FIG. 2.1) may be further improved.

In one or more embodiments, the RMC (310B) includes two portions. The first portion of the RMC (310B) allows the bolts (e.g., 304C) to pass through and interface with a first set of MHs (not shown) located on the top side of the rack (320). When a first set of holes of the RMC (310B) is aligned with the first set of MHs, the bolts (e.g., 304C) are used to secure the RMC (310B) to the top side of the rack (320).

Further, a second set of holes of the RMC (310B) allows a set of bolts to pass through and interface with a first set of RMCMHs (e.g., 407A, FIG. 4.2). When the second set of holes is aligned with the first set of RMCMHs (e.g., 407A, FIG. 4.2), the set of bolts is used to secure the RMC (310B) to the front side of the MORC (309). In this manner, the rack (320) is secured to the MORC (309).

Similarly, the RMC (310C) includes two portions. The first portion of the RMC (310C) allows the bolts (e.g., 304D) to pass through and interface with a second set of MHs (not shown) located on the top side of the rack (320). When a first set of holes of the RMC (310C) is aligned with the second set of MHs, the bolts (e.g., 304D) are used to secure the RMC (310C) to the top side of the rack (320).

Further, a second set of holes of the RMC (310C) allows a set of bolts to pass through and interface with a second set of RMCMHs located on the rear side of the scaffold (e.g., 401, FIG. 4.2). When the second set of holes is aligned with the second set of RMCMHs, the set of bolts is used to secure the RMC (310C) to the rear side of the MORC (309). In this manner, the rack (320) is secured to the MORC (309).

Those skilled in the art will appreciate that while the bolts (e.g., 304C, 304D, etc.) are used to secure the RMCs (310B, 310C) to the top side of the rack (320) and to the MORC (309), any other mechanical or non-mechanical components may be used to secure the secure the RMCs (310B, 310C) to the top side of the rack (320) and to the MORC (309) without departing from the scope of the invention.

As discussed above in reference to FIG. 3.1, the third tray (312B) is affixed to the front side of the MORC (309) and the fourth tray (312D) is affixed to the rear side of the MORC (309). More specifically, the third tray (312B) is affixed to a second FMP (e.g., 440, FIG. 4.5) located on the front side of the MORC (309) and the fourth tray (312D) is affixed to a second FMP (e.g., 440, FIG. 4.5) located on the rear side of the MORC (309).

Similar to the trays (312A, 312C) discussed above in reference to FIG. 3.2, the third tray (312B) includes a third holder (e.g., holder (314B)) and a third set of rods (e.g., 316B). As being mechanical support components, both the third holder (314B) and the third set of rods (e.g., 316B) are configured to carry cables that are routed from one component to another component for power distribution, control, and communication. Further, the third holder (314B) and the third set of rods (e.g., 316B) are configured to prevent cable congestion at the front side of the rack (320) for a better cable management.

The fourth tray (312D) includes a fourth holder (e.g., holder (314D)) and a fourth set of rods (e.g., 316D). As being mechanical support components, both the fourth holder (314D) and the fourth set of rods (e.g., 316D) are configured to carry cables that are routed one component to another component for power distribution, control, and communication. Further, the fourth holder (314D) and the fourth set of rods (e.g., 316D) are configured to prevent cable congestion at the rear side of the rack (320) for a better cable management.

Those skilled in the art will appreciate that while the rods (e.g., 316B, 316D, etc.) and the holders (e.g., 314B, 314D, etc.) are shown as having a particular size, shape, and distribution, the rods (e.g., 316B, 316D, etc.) and the holders (e.g., 314B, 314D, etc.) may have any size, shape, and distribution without departing from the scope of the invention.

FIGS. 4.1 and 4.2 show diagrams of scaffolds (400, 401) of the MORCs (e.g., 308, 309, FIG. 3.1) in accordance with one or more embodiments of the invention.

Turning now to FIG. 4.1, FIG. 4.1 shows a diagram of the scaffold (400) of the MORC (e.g., 308, FIG. 3.1) in accordance with one or more embodiments of the invention. In an embodiment of the invention shown in FIG. 4.1, the scaffold (400) is made of ten components: a ceiling mount component (CMC) (402), a set of isolators (e.g., 404A), a structural support component (SSC) (410), a set of VSSCs (e.g., 406A), a first set of RMCMHs (e.g., 407A), a second set of RMCMHs (not shown), a first set of structural support component mounting holes (SSCMHs) (e.g., 408A), a second set of SSCMHs (not shown), a first set of vertical structural support component mounting holes (VSSCMHs) (e.g., 409A), and a second set of VSSCMHs (not shown), as described in more detail below.

In one or more embodiments, the CMC (402) is a metal framing component (e.g., a strut channel, a unistrut channel, etc.). The CMC (402) includes six sides (i.e., top, bottom, right, left, front, and rear), in which the top side of the CMC (402) is welded to the ceiling of the MITC (e.g., 220, FIG. 2.1). In one or more embodiments, similar to the CMC (402), each isolator includes six sides, in which the top side of each isolator is affixed to the bottom side of the CMC (402).

In one or more embodiments, the set of isolators (e.g., 404A) makes sure that the MORC (e.g., 308, FIG. 3.1) (and the ITCs mounted within) are ready-to-use when the system (e.g., 100, FIG. 1) is deployed to the customer site. In one or more embodiments, the set of isolators (e.g., 404A) provides a shock isolation to the MORC (e.g., 308, FIG. 3.1) such that the ITCs may be protected from any damage.

In one or more embodiments, the SSC (410) includes six sides, in which the top side of the SSC (410) is affixed to the bottom side of each isolator (e.g., 404A). Similar to the CMC (402), the SSC (410) may also be a metal framing component. In one or more embodiments, the SSC (410) includes the set of VSSCs (e.g., 406A), in which the set of VSSCs (e.g., 406A) is disposed within a cavity of the SSC (410). In one or more embodiments, each VSSC is an adjustable metal framing component, in which each VSSC may move (e.g., shift, slide, etc.) right or left along the length of the cavity (shown with arrows). This means that the set of VSSCs (e.g., 406A) are not welded to the SSC (410). Further, based on the number of required ITC openings (e.g., 306A, 306B, FIG. 3.1), an additional VSSC may be attached to the cavity, or an existing VSSC may be detached from the cavity.

As discussed above in reference to FIG. 3.1, for example, to transform five ITC openings (e.g., 306A) into four ITC openings (e.g., 306B), one of the existing VSSCs (e.g., 406A) may be detached from the cavity. As yet another example, in order to have a matching pattern (e.g., a same opening width) with a first FMP (e.g., 430, FIG. 4.4), a position of each VSSC may be reconfigured. After the reconfiguring, in order to restrict movement of each VSSC within the cavity, each VSSC may be secured (e.g., bolted) to the SSC (410).

In one or more embodiments, in case of a seismic event, the SSC (410) may provide structural support to the set of VSSCs (e.g., 406A), particularly, when a first FMP (e.g., 430, FIG. 4.4) or a second FMP (e.g., 440, FIG. 4.5) is affixed to the set of VSSCs (e.g., 406A). The SSC (410) may also provide structural support to the set of VSSCs (e.g., 406A) to keep the set of VSSCs (e.g., 406A) connected to the SSC (410).

In one or more embodiments, in order to generate the MORC (e.g., 308, FIG. 3.1), the following steps need to be performed in order: (i) affix an RMP (e.g., 420, FIG. 4.3) to a front side of the scaffold (400) by securing a set of SSC bolts (e.g., 424A, FIG. 4.3) to the first set of SSCMHs (e.g., 408A) (shown with circles), (ii) affix an RMP (e.g., 420, FIG. 4.3) to a rear side of the scaffold (400) by securing a set of SSC bolts (e.g., 424A, FIG. 4.3) to the second set of SSCMHs, (iii) affix a first FMP (e.g., 430, FIG. 4.4) to the RMP (e.g., 420, FIG. 4.3) located on the front side of scaffold (400) by securing a set of FMP bolts (e.g., 434A, FIG. 4.4) to a set of front mounting plate MHs (FMPMHs) (e.g., 422A, FIG. 4.3), (iv) affix the first FMP (e.g., 430, FIG. 4.4) to the set of VSSCs (e.g., 406A) by securing a set of VSSC bolts (e.g., 436A, FIG. 4.4) to the first set of VSSCMHs (e.g., 409A) (shown with triangles), (v) affix a first FMP (e.g., 430, FIG. 4.4) to the RMP (e.g., 420, FIG. 4.3) located on the rear side of scaffold (400) by securing a set of FMP bolts (e.g., 434A, FIG. 4.4) to a set of FMPMHs (e.g., 422A, FIG. 4.3), (vi) affix the first FMP (e.g., 430, FIG. 4.4) to the set of VSSCs (e.g., 406A) by securing a set of VSSC bolts (e.g., 436A, FIG. 4.4) to the second set of VSSCMHs, (vii) affix the first tray (e.g., 312A, FIG. 3.2) to the first FMP (e.g., 430, FIG. 4.4) located on the front side of the scaffold (400) by securing a set of bolts to a set of holder MHs (e.g., 432A, FIG. 4.4), and (viii) affix the second tray (e.g., 312C, FIG. 3.2) to the first FMP (e.g., 430, FIG. 4.4) located on the rear side of the scaffold (400) by securing a set of bolts to a set of holder MHs (e.g., 432A, FIG. 4.4).

In one or more embodiments, after the MORC (e.g., 308, FIG. 3.1) is generated, the RMC (e.g., 310A, FIG. 3.2) may be affixed to the front side of the scaffold (400) by securing a set of bolts to the first set of RMCMHs (407A) (shown with squares). Similarly, after the MORC (e.g., 308, FIG. 3.1) is generated, a second RMC may be affixed to the rear side of the scaffold (400) by securing a set of bolts to the second set of RMCMHs.

Those skilled in the art will appreciate that while the bolts are used to secure subcomponents (e.g., an FMP, an RMP, etc.) of the MORC (e.g., 308, FIG. 3.1) to the scaffold (400), any other mechanical or non-mechanical components may be used to secure the subcomponents of the MORC (e.g., 308, FIG. 3.1) to the scaffold (400) without departing from the scope of the invention.

Those skilled in the art will appreciate that while the MHs (e.g., SSCMHs, RMCMHs, and the VSSCMHs) are shown as placed at a particular location on the scaffold (400), the MHs may be located on any other side of the scaffold (400) without departing from the scope of the invention.

Turning now to FIG. 4.2, FIG. 4.2 shows a diagram of the scaffold (401) of the MORC (e.g., 309, FIG. 3.1) in accordance with one or more embodiments of the invention. In an embodiment of the invention shown in FIG. 4.2, the scaffold (401) may be the same as the scaffold (400) as discussed above in reference to FIG. 4.1, except one of the VSSCs (406A) is detached from the cavity of the SSC (410) in order to generate four ITC openings (e.g., 306B, FIG. 3.1).

As discussed above in reference to FIG. 3.1, for example, to transform four ITC openings (e.g., 306B) into five ITC openings (e.g., 306A), an additional VSSC (e.g., 406A) may be attached to the cavity. As yet another example, in order to have a matching pattern with a second FMP (e.g., 440, FIG. 4.5), a position of each VSSC may be reconfigured. After the reconfiguring, to restrict movement of each VSSC within the cavity, each VSSC may be bolted to the SSC (410). Details of the SCC and the set of VSSCs are described above in reference to FIG. 4.1.

In one or more embodiments, in order to generate the MORC (e.g., 309, FIG. 3.1), the following steps need to be performed in order: (i) affix an RMP (e.g., 420, FIG. 4.3) to a front side of the scaffold (401) by securing a set of SSC bolts (e.g., 424A, FIG. 4.3) to the first set of SSCMHs (e.g., 408A) (shown with circles), (ii) affix an RMP (e.g., 420, FIG. 4.3) to a rear side of the scaffold (401) by securing a set of SSC bolts (e.g., 424A, FIG. 4.3) to the second set of SSCMHs, (iii) affix a second FMP (e.g., 440, FIG. 4.5) to the RMP (e.g., 420, FIG. 4.3) located on the front side of scaffold (401) by securing a set of FMP bolts (e.g., 444A, FIG. 4.5) to a set of FMPMHs (e.g., 422A, FIG. 4.3), (iv) affix the second FMP (e.g., 440, FIG. 4.5) to the set of VSSCs (e.g., 406A) by securing a set of VSSC bolts (e.g., 446A, FIG. 4.5) to the first set of VSSCMHs (e.g., 409A) (shown with triangles), (v) affix a second FMP (e.g., 440, FIG. 4.5) to the RMP (e.g., 420, FIG. 4.3) located on the rear side of scaffold (401) by securing a set of FMP bolts (e.g., 444A, FIG. 4.5) to a set of FMPMHs (e.g., 422A, FIG. 4.3), (vi) affix the second FMP (e.g., 440, FIG. 4.5) to the set of VSSCs (e.g., 406A) by securing a set of VSSC bolts (e.g., 446A, FIG. 4.5) to the second set of VSSCMHs, (vii) affix the third tray (e.g., 312B, FIG. 3.3) to the second FMP (e.g., 440, FIG. 4.5) located on the front side of the scaffold (401) by securing a set of bolts to a set of holder MHs (e.g., 442A, FIG. 4.5), and (viii) affix the fourth tray (e.g., 312D, FIG. 3.3) to the second FMP (e.g., 440, FIG. 4.5) located on the rear side of the scaffold (401) by securing a set of bolts to a set of holder MHs (e.g., 442A, FIG. 4.5).

In one or more embodiments, after the MORC (e.g., 309, FIG. 3.1) is generated, the RMC (e.g., 310B, FIG. 3.3) may be affixed to the front side of the scaffold (401) by securing a set of bolts to the first set of RMCMHs (407A) (shown with squares). Similarly, after the MORC (e.g., 309, FIG. 3.1) is generated, the RMC (e.g., 310C, FIG. 3.3) may be affixed to the rear side of the scaffold (401) by securing a set of bolts to the second set of RMCMHs.

Turning now to FIG. 4.3, FIG. 4.3 shows a diagram of the RMP (420) in accordance with one or more embodiments of the invention. In an embodiment of the invention shown in FIG. 4.3, the RMP (420) may include the set of FMPMHs (e.g., 422A), the set of SSC bolts (e.g., 424A), a reconfiguration opening (426), and one or more RMC openings (e.g., 428A).

As discussed above in reference to FIG. 4.1, for example, the RMP (420) may be affixed to a front side of the scaffold (e.g., 400, FIG. 4.1) by securing the set of SSC bolts (e.g., 424A) to the first set of SSCMHs (e.g., 408A, FIG. 4.1). After affixing the RMP (420) to the front side of the scaffold (e.g., 400, FIG. 4.1), a first FMP (e.g., 430, FIG. 4.4) may be affixed to the RMP (420) by securing a set of FMP bolts (e.g., 434A, FIG. 4.4) to the set of FMPMHs (e.g., 422A).

In one or more embodiments, the reconfiguration opening (426) may allow, for example, the set of VSSC bolts (e.g., 436A, FIG. 4.4) to pass through and interface with the first set of VSSCMHs (e.g., 409A, FIG. 4.1) in order to affix the first FMP (e.g., 430, FIG. 4.4) to the set of VSSCs (e.g., 406A, FIG. 4.1). Similarly, the RMC openings (e.g., 428A) may allow, for example, the set of bolts to pass through and interface with the first set of RMCMHs (e.g., 407A, FIG. 4.1) in order to affix the RMC (e.g., 310A, FIG. 3.2) to the front side of the scaffold (e.g., 400, FIG. 4.1).

The aforementioned examples are not intended to limit the scope of the invention.

Those skilled in the art will appreciate that the set of SSC bolts (e.g., 424A) are used to affix the RMP (420) to the scaffold (e.g., 400, FIG. 4.1), any other mechanical or non-mechanical components may be used to affix the RMP (420) to the scaffold (e.g., 400, FIG. 4.1) without departing from the scope of the invention.

Those skilled in the art will appreciate that while the FMPMHs (e.g., 422A) are shown as placed at particular locations on the RMP (420), the FMPMHs (e.g., 422A) may be placed at any other location on the RMP (420) without departing from the scope of the invention.

Those skilled in the art will appreciate that while the RMC openings (e.g., 428A) are shown as rectangular openings, the RMC openings (e.g., 428A) may be in another shape (while still providing the same functionalities) without departing from the scope of the invention.

Those skilled in the art will appreciate that while the RMC openings (e.g., 428A) are shown as having the same size along the length of the RMP (420), the RMC openings (e.g., 428A) may have different sizes along the length of the RMP (420) without departing from the scope of the invention.

FIGS. 4.4 and 4.5 show diagrams of the FMPs (430, 440) having different number of ITC openings (e.g., 438A) in accordance with one or more embodiments of the invention.

Turning now to FIG. 4.4, FIG. 4.4 shows a diagram of the first FMP (430) in accordance with one or more embodiments of the invention. In an embodiment of the invention shown in FIG. 4.4, the first FMP (430) includes the set of FMP bolts (e.g., 434A), the set of VSSC bolts (e.g., 436A), the set of holder MHs (e.g., 432A), and five ITC openings (e.g., 438A). The ITC openings (e.g., 438A) may be the same as the ITC openings (e.g., 306A) as discussed above in reference to FIG. 3.1, in which the ITC openings (e.g., 438A) match with the openings generated by the set of VSSCs (e.g., 406A, FIG. 4.1). Details of the ITC openings are described above in reference to FIG. 3.1.

As discussed above in reference to FIG. 4.1, for example, the first FMP (430) may be affixed to the RMP (e.g., 420, FIG. 4.3) by securing the set of FMP bolts (434A) to the set of FMPMHs (e.g., 422A, FIG. 4.3). Further, the first tray (e.g., 312A, FIG. 3.2) may be affixed to the first FMP (430) by securing a set of bolts to the set of holder MHs (432A). In one or more embodiments, the first FMP (430) may be, for example (but not limited to): a sheet metal, a plastic plate, etc.

Those skilled in the art will appreciate that while the set of FMP bolts (e.g., 434A) are used to affix the first FMP (430) to the RMP (e.g., 420, FIG. 4.3), any other mechanical or non-mechanical components may be used to affix the first FMP (430) to the RMP (e.g., 420, FIG. 4.3) without departing from the scope of the invention.

Those skilled in the art will appreciate that while the holder MHs (e.g., 432A) are shown as placed at particular locations on the first FMP (430), the holder MHs (e.g., 432A) may be placed at any other location on the first FMP (430) without departing from the scope of the invention.

Those skilled in the art will appreciate that while the ITC openings (e.g., 438A) are shown as rectangular openings, the ITC openings (e.g., 438A) may be in another shape (while still providing the same functionalities) without departing from the scope of the invention.

Those skilled in the art will appreciate that while the ITC openings (e.g., 438A) are shown as having the same size along the length of the first FMP (430), the ITC openings (e.g., 438A) may have different sizes along the length of the first FMP (430) without departing from the scope of the invention.

Turning now to FIG. 4.5, FIG. 4.5 shows a diagram of the second FMP (440) in accordance with one or more embodiments of the invention. In an embodiment of the invention shown in FIG. 4.5, the second FMP (440) includes the set of FMP bolts (e.g., 444A), the set of VSSC bolts (e.g., 446A), the set of holder MHs (e.g., 442A), and four ITC openings (e.g., 438A). The ITC openings (e.g., 438A) match with the openings generated by the set of VSSCs (e.g., 406A, FIG. 4.2).

As discussed above in reference to FIG. 4.1, for example, the second FMP (440) may be affixed to the RMP (e.g., 420, FIG. 4.3) by securing the set of FMP bolts (444A) to the set of FMPMHs (e.g., 422A, FIG. 4.3). Further, the third tray (e.g., 312B, FIG. 3.3) may be affixed to the second FMP (440) by securing a set of bolts to the set of holder MHs (442A). In one or more embodiments, the second FMP (440) may be, for example (but not limited to): a sheet metal, a plastic plate, etc.

Those skilled in the art will appreciate that while the set of FMP bolts (e.g., 444A) are used to affix the second FMP (440) to the RMP (e.g., 420, FIG. 4.3), any other mechanical or non-mechanical components may be used to affix the second FMP (440) to the RMP (e.g., 420, FIG. 4.3) without departing from the scope of the invention.

Those skilled in the art will appreciate that while the holder MHs (e.g., 442A) are shown as placed at particular locations on the second FMP (440), the holder MHs (e.g., 442A) may be placed at any other location on the second FMP (440) without departing from the scope of the invention.

Those skilled in the art will appreciate that while the ITC openings (e.g., 438A) are shown as having the same size along the length of the second FMP (440), the ITC openings (e.g., 438A) may have different sizes along the length of the second FMP (440) without departing from the scope of the invention.

In one or more embodiments, based on above-discussed reconfigurable MORC designs, a customer may have a flexibility to re-align ITC openings of a MORC to accommodate various alterations occurred in the white space without replacing the entire MORC. In this manner, for example, the customer may affix or remove components to or from the white space over time without worrying about the effect of alterations.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular information technology component (MITC), comprising:
   a modular over-rack component (MORC); and
   an information technology component (ITC),
      wherein the MORC comprises a set of ITC openings,
      wherein the set of ITC openings enables mounting of the ITC into the MORC,
      wherein the MORC further comprises a scaffold, wherein the scaffold comprises a set of shock isolators, a ceiling mount component (CMC), a structural support component (SSC), and a set of vertical structural support components (VSSCs),
      wherein the SSC is affixed to the set of isolators,
      wherein the set of isolators is affixed to the CMC,
      wherein the CMC is affixed to a ceiling of the MITC,
      wherein the set of VSSCs is affixed to an internal volume of the SSC,
      wherein the set of VSSCs slides within the internal volume of the SSC to reconfigure a size of an opening within the set of ITC openings to accommodate an information handling system (IHS) and a second IHS, wherein an outer width of the second IHS is greater than an outer width of the IHS.

2. The MITC of claim 1, further comprising:
   a rack mounting component (RMC), wherein the RMC affixes the IHS to the MORC, and wherein the RMC provides air containment within an internal environment of the MITC.

3. The MITC of claim 1, further comprising:
   a tray, wherein the tray is affixed to the MORC, wherein the tray is configured to carry cables of the ITC, and wherein the cables transmit or receive power and data from a second ITC.

4. The MITC of claim 1, wherein the MORC further comprises a front mounting plate (FMP),
   wherein the FMP comprises a second set of ITC openings, and
   wherein a position of the second set of ITC openings and a position of the set of VSSCs generate the set of ITC openings.

5. The MITC of claim 1,
   wherein the set of isolators provides a shock isolation to the MORC.

6. The MITC of claim 1, wherein the MORC further comprises a rear mounting plate (RMP),
   wherein the RMP comprises a reconfiguration opening,
   wherein the RMP is affixed to a scaffold, and
   wherein the reconfiguration opening permits the scaffold to host different front mounting plates (FMPs).

7. The MITC of claim 1, further comprising:
   a plurality of IHSs, wherein each IHS comprises a rack and a plurality of computing devices, wherein the rack is a housing for the plurality of computing devices.

8. The MITC of claim 1, wherein the ITC is a network switch.

9. A modular data center, comprising:
   a modular information technology component (MITC),
      wherein the MITC comprises a modular over-rack component (MORC),
      wherein the MORC comprises a set of information technology component (ITC) openings, wherein the set of ITC openings enables mounting of an ITC into the MORC,
      wherein the MORC further comprises a scaffold, wherein the scaffold comprises a set of shock isolators, a ceiling mount component (CMC), a structural support component (SSC), and a set of vertical structural support components (VSSCs),
      wherein the SSC is affixed to the set of isolators,
      wherein the set of isolators is affixed to the CMC,
      wherein the CMC is affixed to a ceiling of the MITC,
      wherein the set of VSSCs is affixed to an internal volume of the SSC,
      wherein the set of VSSCs slides within the internal volume of the SSC to reconfigure a size of an opening within the set of ITC openings to accommodate an information handling system (IHS) and a second IHS, wherein an outer width of the second IHS is greater than an outer width of the IHS; and a modular environmental control component (MECC),
wherein the MECC comprises a plurality of environmental control components (ECCs) and built-in airflow connection components, wherein the built-in airflow connection components remove and supply air to the MITC.

10. The modular data center of claim 9, wherein the MITC further comprises a rack mounting component (RMC),
wherein the RMC affixes the IHS to the MORC, and
wherein the RMC provides air containment within an internal environment of the MITC.

11. The modular data center of claim 9, the MITC further comprises a tray,
wherein the tray is affixed to the MORC,
wherein the tray carries cables of the ITC, and
wherein the cables transmit or receive power and data from a second ITC.

12. The modular data center of claim 9, wherein the MORC further comprises a front mounting plate (FMP),
wherein the FMP comprises a second set of ITC openings, and
wherein a position of the second set of ITC openings and a position of the set of VSSCs generate the set of ITC openings.

13. The modular data center of claim 9, wherein the MORC further comprises a rear mounting plate (RMP),
wherein the RMP comprises a reconfiguration opening,
wherein the RMP is affixed to a scaffold, and
wherein the reconfiguration opening permits the scaffold to host different front mounting plates (FMPs).

14. The modular data center of claim 9, wherein the MITC comprises a plurality of IHSs, wherein each IHS comprises a rack and a plurality of computing devices, wherein the rack is a housing for the plurality of computing devices.

* * * * *